United States Patent
Yamada (10) Patent No.: US 8,553,102 B2
(45) Date of Patent: Oct. 8, 2013

(54) ELECTRONIC APPARATUS INCLUDING MULTIPLE DIFFERENTIAL SIGNAL LINES

(75) Inventor: Motonari Yamada, Tokyo (JP)

(73) Assignee: Canon Kabushiki Kaisha (JP)

( * ) Notice: Subject to any disclaimer, the term of this patent is extended or adjusted under 35 U.S.C. 154(b) by 209 days.

(21) Appl. No.: 12/703,445

(22) Filed: Feb. 10, 2010

(65) Prior Publication Data

US 2010/0201838 A1 Aug. 12, 2010

(30) Foreign Application Priority Data

Feb. 10, 2009 (JP) ................................. 2009-028532

(51) Int. Cl.
*H04N 5/228* (2006.01)

(52) U.S. Cl.
USPC .................... 348/222.1; 439/55; 439/540.1

(58) Field of Classification Search
USPC ....................... 333/1; 439/540.1, 55
See application file for complete search history.

(56) References Cited

U.S. PATENT DOCUMENTS

| | | | |
|---|---|---|---|
| 6,743,045 B1 * | 6/2004 | Hayashi et al. | 439/495 |
| 6,867,668 B1 * | 3/2005 | Dagostino et al. | 333/246 |
| 6,902,433 B1 * | 6/2005 | Hashimoto et al. | 439/620.15 |
| 2005/0206733 A1 * | 9/2005 | Miyamoto | 348/207.1 |
| 2006/0066417 A1 * | 3/2006 | Yamanaga et al. | 333/33 |
| 2007/0040626 A1 * | 2/2007 | Blair et al. | 333/1 |
| 2007/0153120 A1 * | 7/2007 | Kajikawa et al. | 348/373 |
| 2009/0042451 A1 * | 2/2009 | He et al. | 439/660 |
| 2009/0093137 A1 * | 4/2009 | Badehi et al. | 439/61 |
| 2009/0096137 A1 * | 4/2009 | Williams et al. | 264/540 |
| 2010/0042770 A1 * | 2/2010 | Chuang | 710/304 |
| 2010/0190373 A1 * | 7/2010 | Yeh | 439/499 |

FOREIGN PATENT DOCUMENTS

| | | |
|---|---|---|
| JP | 2001-267701 A | 9/2001 |
| JP | 2002-289991 A | 10/2002 |
| JP | 2006-128618 A | 5/2006 |
| JP | 2007-166290 A | 6/2007 |
| JP | 2008-216537 A | 9/2008 |

OTHER PUBLICATIONS

JP Office Action issued Dec. 18, 2012 for corresponding JP2009-028532.

* cited by examiner

*Primary Examiner* — Roberto Velez
*Assistant Examiner* — Abdelaaziz Tissire
(74) *Attorney, Agent, or Firm* — Rossi, Kimms & McDowell LLP

(57) ABSTRACT

An electronic apparatus that can prevent occurrence of crosstalk between different differential signals on a printed circuit board on which a wiring pattern of a differentially operated signal line is formed, and reduce unnecessary radiation noises. First and second wiring patterns are disposed on the printed circuit board and through which differentially operated signals are transmitted, and the first and second wiring patterns are electrically connected to first and second connection terminals, respectively. An electronic component is disposed on the printed circuit board, and includes first and second terminals electrically connected to the first and second wiring patterns, respectively. The first and second terminals of the electronic component are disposed on the printed circuit board, respectively, so that the first and second wiring patterns do not intersect each other.

15 Claims, 5 Drawing Sheets

ELECTRONIC APPARATUS INCLUDING MULTIPLE DIFFERENTIAL SIGNAL LINES

BACKGROUND OF THE INVENTION

1. Field of the Invention

The present invention relates to an electronic apparatus including a printed circuit board having a wiring pattern of a differentially operated signal line.

2. Description of the Related Art

Conventional differential transmission paths mounted on a printed circuit board included in an electronic apparatus comprise differential transmission paths of USB (Universal Serial Bus) standard or HDMI (High-Definition Multimedia Interface) standard. For such differential transmission paths, each characteristic impedance of a pair of differential transmission paths needs to be uniform at a value determined by each standard.

Meanwhile, with increasing performance and added value of an electronic apparatus, a printed circuit board including an electronic circuit for realizing higher performance and added value has achieved higher speed of a circuit operation or higher density of signal lines (wiring pattern). With increasing speed of the circuit operation, a frequency of a clock line increases, which may cause unnecessary radiation noises. Also, with increasing signal lines, signal lines that function as noise sources are arranged adjacent to each other, which may cause crosstalk (interference of noises). This has made it difficult to obtain a uniform characteristic impedance.

A technique on a pattern layout has been proposed for reducing unnecessary radiation noises of a differential transmission path as described above, and preventing crosstalk with other signals (for example, see Japanese Laid-Open Patent Publication (Kokai) No. 2001-267701).

However, since an electronic circuit having a differential transmission path of USB standard or HDMI standard has been heretofore independently mounted on a printed circuit board, it has been only necessary to note a pattern layout associated with a pair of differential transmission paths and other signal lines. However, with increasing performance or added value of an electronic apparatus, differential transmission paths of a plurality of standards have been mounted on the same printed circuit board, and thus there is a problem in which interference between differential transmission paths having characteristic impedances of different values occurs.

SUMMARY OF THE INVENTION

The present invention provides an electronic apparatus that can prevent occurrence of crosstalk between different differential signals on a printed circuit board on which a wiring pattern of a differentially operated signal line is formed, and reduce unnecessary radiation noises.

Accordingly, the present invention provides an electronic apparatus including a printed circuit board comprising a first wiring pattern adapted to be disposed on the printed circuit board and through which a differentially operated signal is transmitted, a first connection terminal adapted to be electrically connected to the first wiring pattern, a second wiring pattern adapted to be disposed on the printed circuit board and through which a differentially operated signal is transmitted, a second connection terminal adapted to be electrically connected to the second wiring pattern, and an electronic component adapted to be disposed on the printed circuit board, and include a first terminal and a second terminal electrically connected to the first wiring pattern and the second wiring pattern, respectively, wherein the first terminal and the second terminal of the electronic component are disposed on the printed circuit board, respectively, so that the first wiring pattern and the second wiring pattern do not intersect each other.

According to the present invention, the first terminal and the second terminal of the electronic component are disposed in positions corresponding to the disposing place of the first connection terminal and the disposing place of the second connection terminal, respectively, so that the first wiring pattern and the second wiring pattern do not intersect each other. This can prevent occurrence of crosstalk between different differential signals on the printed circuit board, and reduce unnecessary radiation noises.

Further features of the present invention will become apparent from the following description of exemplary embodiments (with reference to the attached drawings).

DESCRIPTION OF THE EMBODIMENTS

The present invention will now be described with reference to the drawings.

Figure 1:
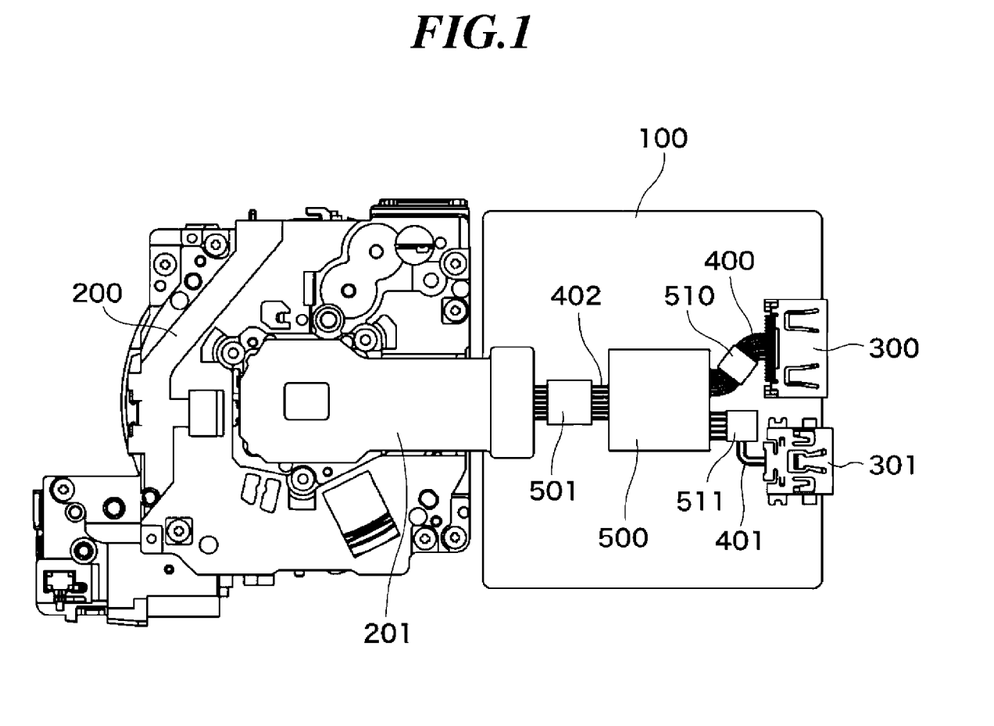
FIG. 1 is a front view schematically showing a configuration of a wiring pattern on a printed circuit board included in an image pickup apparatus as an electronic apparatus according to a first embodiment of the present invention.
Figure 2:
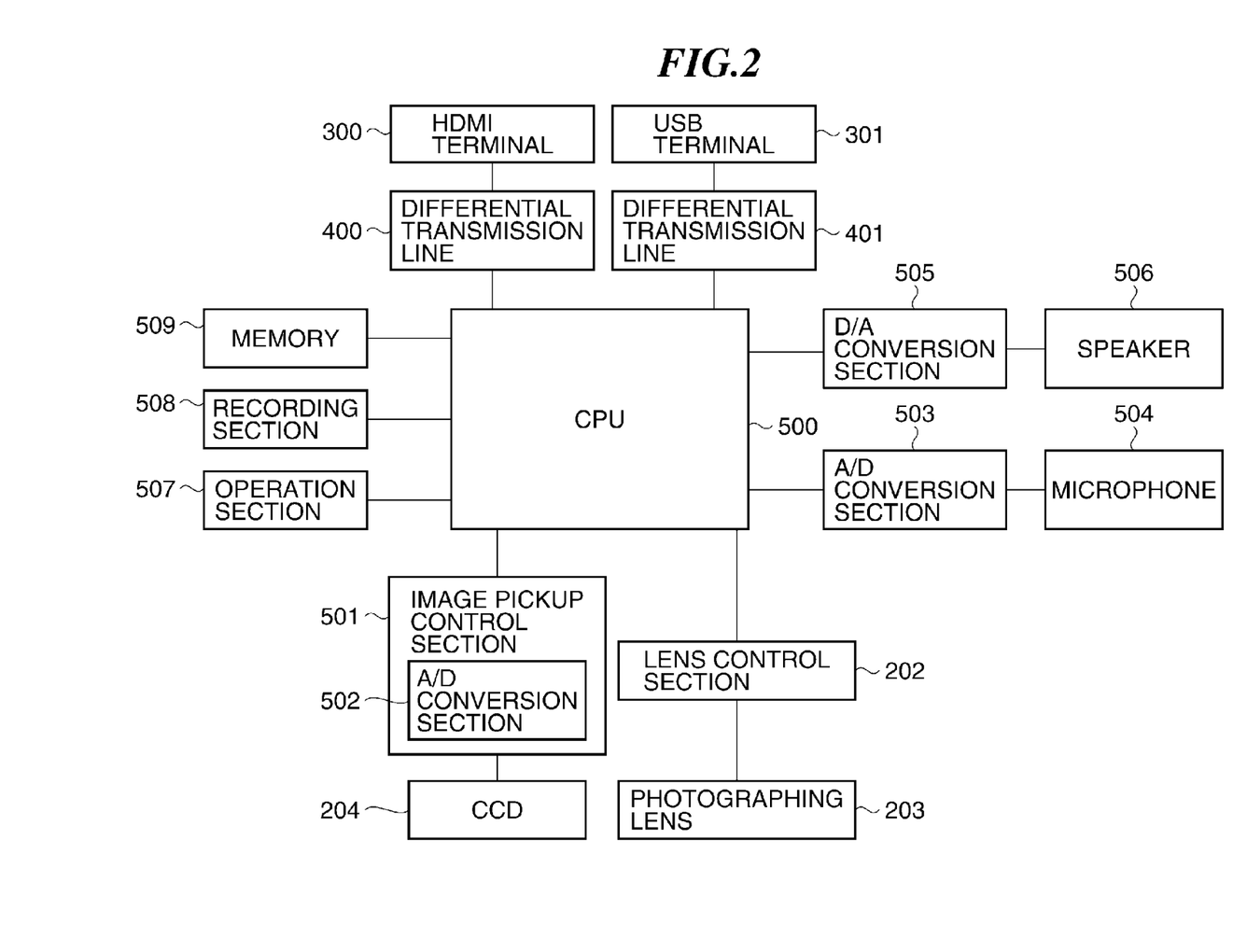
FIG. 2 is a block diagram schematically showing a configuration of the image pickup apparatus including the printed circuit board in FIG. 1.

FIG. 1 is a front view schematically showing a configuration of a wiring pattern on a printed circuit board included in an image pickup apparatus as an electronic apparatus according to a first embodiment of the present invention. FIG. 2 is a block diagram schematically showing a configuration of the image pickup apparatus including the printed circuit board in FIG. 1.

In this embodiment and embodiments described later, a case will be described where a wiring structure of the printed circuit board of the present invention is applied to an image pickup apparatus (digital camera).

In FIGS. 1 and 2, the image pickup apparatus includes a lens barrel 200, a printed circuit board 100, and a CCD signal transmission board 201 in an image pickup apparatus body. The image pickup apparatus includes a CPU 500, a image pickup lens 203, a lens control section 202, an image pickup device (hereinafter referred to as CCD) 204, an image pickup control section 501, an A/D conversion section 503, and a microphone 504. Further, the image pickup apparatus includes an D/A conversion section 505, a speaker 506, an operation section 507, a recording section 508, a memory 509, a differential transmission path 400, an HDMI terminal 300, a differential transmission path 401, and a USB terminal 301.

In this embodiment, the CPU 500 (electronic component), and the HDMI terminal 300 and the USB terminal 301 to be connected to an external interface (not shown) are mounted on the same printed circuit board 100 on which a wiring pattern of a differentially operated signal line is formed.

The lens barrel 200 includes the image pickup lens 203 and the CCD 204. On the printed circuit board 100, the CPU 500, the image pickup control section 501, a signal line 402, an HDMI driver IC 510, the differential transmission path 400, the HDMI terminal 300, a USB driver IC 511, the differential transmission path 401, and the USB terminal 301 are mounted. Between the image pickup control section 501 on the printed circuit board 100 and the lens barrel 200, the CCD signal transmission board 201 is connected.

More specifically, the CPU 500 is mounted substantially at the center of the printed circuit board 100. The HDMI terminal 300 and the USB terminal 301 are mounted at an end on one side of a mounting place (disposing place) of the CPU 500 on the printed circuit board 100. Also, the image pickup control section 501 is mounted on the other side of the mounting place (disposing place) of the CPU 500 on the printed circuit board 100.

The HDMI terminal 300 (first connection terminal) is electrically connected to the differential transmission path 400 (first wiring pattern). The USB terminal 301 (second connection terminal) is electrically connected to the differential transmission path 401 (second wiring pattern). The CPU 500 is electrically connected to the HDMI terminal 300 via the HDMI driver IC 510 that controls each signal and the differential transmission path 400. The CPU 500 is electrically connected to the USB terminal 301 via the USB driver IC 511 that controls each signal and the differential transmission path 401. The CPU 500 is electrically connected to the image pickup control section 501 (an image pickup control unit) that controls the CCD 204 (an image pickup unit).

A differentially operated signal is transmitted through the differential transmission path 400 to the HDMI terminal 300, which is wired so that a differential characteristic impedance value is, for example, 100Ω. The differential transmission path 400 is a wiring pattern through which a signal of HDMI standard is transmitted. A differentially operated signal is transmitted through the differential transmission path 401 to the USB terminal 301, which is wired so that a differential characteristic impedance value is, for example, 90Ω. The differential transmission path 401 is a wiring pattern through which a signal of USB standard is transmitted.

The image pickup control section 501 includes an A/D conversion section 502 and controls the CCD 204. The operation section 507 is used for various operations or settings in shooting with the image pickup apparatus. The recording section 508 records digital data (image data) of a shot image or digital data of sound. The memory 509 stores various data. The CPU 500 can read the digital data of the image or the digital data of the sound recorded in the recording section 508, and perform data communication with an external device (a television receiver (hereinafter referred to as a television), a personal computer, or the like) via the HDMI terminal 300 and the USB terminal 301.

The HDMI terminal 300 and the USB terminal 301 are arranged next to each other on a side surface of an image pickup apparatus casing. The image pickup control section 501 mounted on the printed circuit board 100 is disposed inside the image pickup apparatus casing. Also, as described above, the CPU 500 is disposed between the HDMI terminal 300 or the USB terminal 301 and the image pickup control section 501 on the printed circuit board 100.

Next, an operation of the image pickup apparatus will be briefly described. A subject image having passed through the image pickup lens 203 by shooting is formed on an image pickup surface of the CCD 204, and photoelectrically converted into an electric signal by the CCD 204. Image data generated by photoelectrically converting the subject image is transmitted via the CCD signal transmission board 201 to the image pickup control section 501 mounted on the printed circuit board 100.

The image pickup control section 501 drives the CCD 204 via the CCD signal transmission board 201 to obtain the image data generated by photoelectrically converting the subject image, and transfers the image data, which is A/D converted by the A/D conversion section 502, to the CPU 500. The CPU 500 performs signal processing on the image data after the A/D conversion, and outputs and records the image data to and in the recording section 508.

The microphone 504 is used for sound input in shooting moving images with the image pickup apparatus, or sound annotation to the shot moving images by a photographer. The A/D conversion section 503 sends digital data obtained by A/D converting the sound input from the microphone 504 to the CPU 500. The CPU 500 records the digital data in the recording section 508. In reproducing the sound, the CPU 500 sends the digital data read from the recording section 508 to the D/A conversion section 505 to D/A convert the sound. This can cause the speaker 506 to sound to reproduce the sound.

Figure 3:
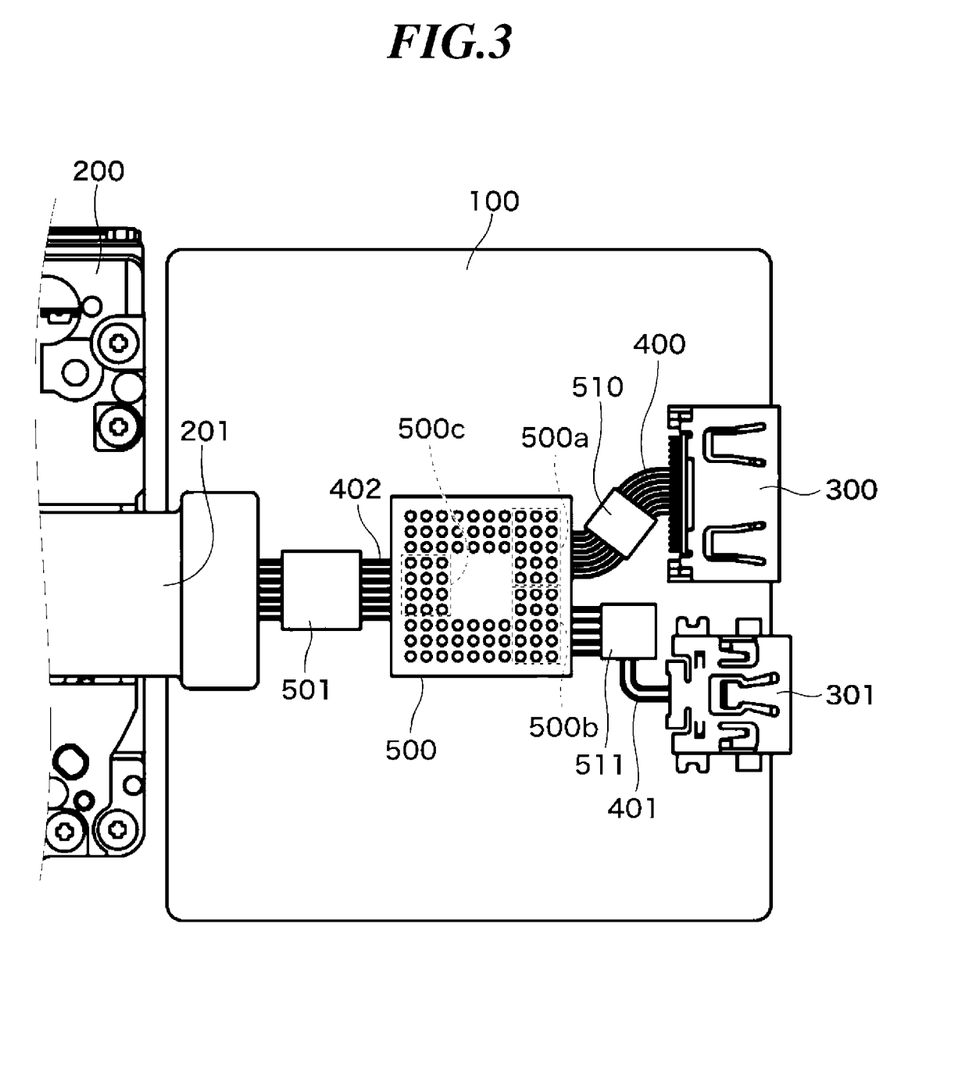
FIG. 3 is a front perspective view schematically showing the configuration of the wiring pattern on the printed circuit board in FIG. 1.

FIG. 3 is a front perspective view schematically showing the configuration of the wiring pattern of the printed circuit board in FIG. 1.

In FIG. 3, the CPU 500 includes a first terminal 500a, a second terminal 500b, and a third terminal 500c. The first terminal 500a of the CPU 500 is connected to a signal line of the differential transmission path 400 and the HDMI driver IC 510 connected to the HDMI terminal 300. The second terminal 500b of the CPU 500 is connected to a signal line of the differential transmission path 401 and the USB driver IC 511 connected to the USB terminal 301.

The third terminal 500c of the CPU 500 is connected to the signal line 402 (third wiring pattern) of the image pickup control section 501. The third terminal 500c of the CPU 500 is disposed so as not to intersect the differential transmission path 400 and the differential transmission path 401.

The first terminal 500a connected to the HDMI terminal 300, or the second terminal 500b connected to the USB terminal 301, and the third terminal 500c connected to the image pickup control section 501 are arranged to face each other via a predetermined space on a surface of the CPU 500. The first terminal 500a and the second terminal 500b of the CPU 500 are disposed in positions corresponding to a mounting place (disposing place) of the HDMI terminal 300 and a mounting place (disposing place) of the USB terminal 301 so that the differential transmission path 400 and the differential transmission path 401 do not intersect each other.

As described above in detail, according to this embodiment, the first terminal 500a and the second terminal 500b of the CPU 500 are disposed in the positions corresponding to the mounting places of the HDMI terminal 300 and the USB terminal 301 so that the differential transmission path 400 and the differential transmission path 401 do not intersect each other. This can prevent occurrence of crosstalk between different differential signals on the printed circuit board 100, and reduce unnecessary radiation noises.

Also, among the two differential transmission paths, one differential transmission path 400 has a wiring pattern of a signal of HDMI standard and the other differential transmission path 401 has a wiring pattern of a signal of USB standard. This can prevent occurrence of crosstalk between differential signals having different characteristic impedance values, and prevent a reduction in transmission quality of signals due to disturbance of the impedance values.

The third terminal 500c of the CPU 500 is disposed so as not to intersect the differential transmission path 400 and the differential transmission path 401. This can prevent occurrence of crosstalk between a clock line having a high frequency with increasing speed of the operation of the image pickup control section 501 and a differential signal, and reduce unnecessary radiation noises.

The HDMI terminal 300 and the USB terminal 301 are disposed next to each other on the side surface of the image pickup apparatus casing, the image pickup control section 501 is disposed inside the image pickup apparatus casing, and the CPU 500 is disposed between the HDMI terminal 300 or the USB terminal 301 and the image pickup control section 501. This can prevent occurrence of crosstalk between differential signals of a clock line of the circuit that controls the CCD disposed substantially at the center of the image pickup apparatus and a signal line connected to a connector (HDMI terminal and USB terminal) disposed on an outer periphery of the image pickup apparatus as an external interface. Further, the CCD and the connector can be efficiently disposed.

A second embodiment of the present invention is different from the first embodiment in the following points. Other elements in this embodiment are the same as those in the first embodiment (FIGS. 1 and 2), and thus descriptions thereof will be simplified or omitted in FIG. 4 described below.

The first embodiment has the configuration in which the CPU 500, and the HDMI terminal 300 and the USB terminal 301 to be connected to the external interface are mounted on the same printed circuit board.

Meanwhile, this embodiment has a configuration in which an HDMI terminal 300 and a USB terminal 301 are mounted on two relay boards, respectively, and the two relay boards are connected to a printed circuit board by relay connectors.

Figure 4:
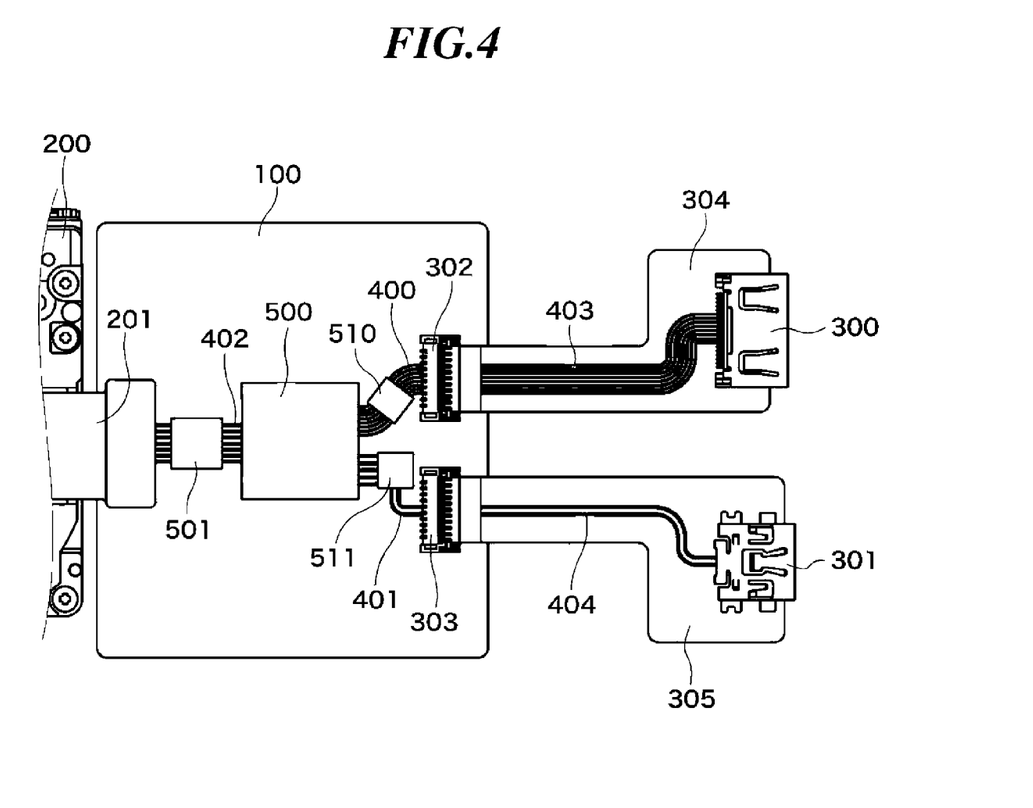
FIG. 4 is a front view schematically showing a configuration of a wiring pattern on a printed circuit board included in an image pickup apparatus as an electronic apparatus according to a second embodiment of the present invention.

FIG. 4 is a front view schematically showing a configuration of a wiring pattern of a printed circuit board included in an image pickup apparatus as an electronic apparatus according to this embodiment.

In FIG. 4, the image pickup apparatus includes a lens barrel 200, a printed circuit board 100, a CCD signal transmission board 201, a first relay board 304, and a second relay board 305 in an image pickup apparatus body, and is configured to be able to perform data communication with an external device. The lens barrel 200 includes a image pickup lens 203 and a CCD 204 (see FIG. 2).

On the printed circuit board 100, a CPU 500, an image pickup control section 501, a signal line 402, an HDMI driver IC 510, a differential transmission path 400 of HDMI standard, and a first relay connector 302 are mounted. Further, on the printed circuit board 100, a USB driver IC 511, a differential transmission path 401 of USB standard, and a second relay connector 303 are mounted. The CCD signal transmission board 201 is connected between the image pickup control section 501 on the printed circuit board 100 and the lens barrel 200.

More specifically, the first relay connector 302 and the second relay connector 303 are mounted on one side of a mounting place of the CPU 500 on the printed circuit board 100. The first relay board 304 is connected to the printed circuit board 100 via the first relay connector 302. The second relay board 305 is connected to the printed circuit board 100 via the second relay connector 303. On the first relay board 304, a differential transmission path 403 of HDMI standard and the HDMI terminal 300 are mounted. On the second relay board 305, a differential transmission path 404 of USB standard and the USB terminal 301 are mounted.

The HDMI terminal 300 is connected to the HDMI driver IC 510 via the differential transmission path 403 mounted on the first relay board 304 and the differential transmission path 400 mounted on the printed circuit board 100, and further electrically connected therefrom to the CPU 500. The USB terminal 301 is connected to the USB driver IC 511 via the differential transmission path 404 mounted on the second relay board 305 and the differential transmission path 401 mounted on the printed circuit board 100, and further electrically connected therefrom to the CPU 500. The HDMI driver IC 510 and the USB driver IC 511 are electrically connected to the CPU 500 to transmit and receive signals.

As described above in detail, according to this embodiment, the HDMI terminal 300 and the USB terminal 301 are mounted on the two relay boards, and the two relay boards are connected to the printed circuit board 100 by the relay connectors, respectively. This can prevent occurrence of crosstalk between the differential signals having different characteristic impedance values on the printed circuit board 100, and reduce unnecessary radiation noises. This also allows free board layout design.

A third embodiment of the present invention is different from the first embodiment in the following points. Other elements in this embodiment are the same as those in the first embodiment (FIGS. 1 and 2), and thus descriptions thereof will be simplified or omitted in FIG. 5 described below.

The second embodiment has the configuration in which the HDMI terminal 300 and the USB terminal 301 are mounted on the two relay boards, respectively, and the two relay boards are connected to the printed circuit boards by the relay connectors.

Meanwhile, this embodiment has a configuration in which a HDMI terminal 300 is mounted on a printed circuit board, a USB terminal 301 is mounted on a relay board, and the relay board is connected to the printed circuit board by a relay connector.

Figure 5:
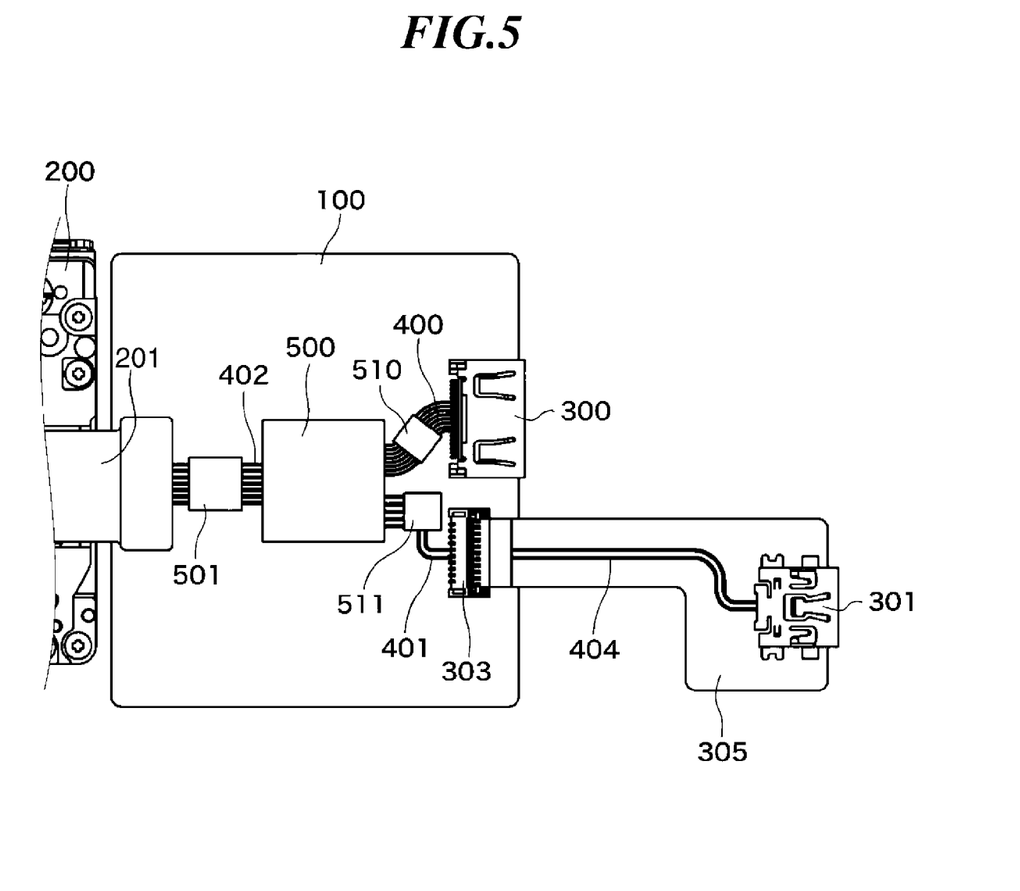
FIG. 5 is a front view schematically showing a configuration of a wiring pattern of a printed circuit board included in an image pickup apparatus as an electronic apparatus according to a third embodiment of the present invention.

FIG. 5 is a front view schematically showing a configuration of a wiring pattern of a printed circuit board included in an image pickup apparatus as an electronic apparatus according to this embodiment.

In FIG. 5, the image pickup apparatus includes a lens barrel 200, a printed circuit board 100, a CCD signal transmission board 201, and a relay board 305 in an image pickup apparatus body, and is configured to be able to perform data communication with an external device. The lens barrel 200 includes a image pickup lens 203 and a CCD 204 (see FIG. 2).

On the printed circuit board 100, a CPU 500, an image pickup control section 501, a signal line 402, an HDMI driver IC 510, a differential transmission path 400 of HDMI standard, and an HDMI terminal 300 are mounted. Further, on the printed circuit board 100, a USB driver IC 511, a differential transmission path 401 of USB standard, and a relay connector 303 are mounted. The CCD signal transmission board 201 is connected between the image pickup control section 501 on the printed circuit board 100 and the lens barrel 200.

More specifically, the HDMI terminal 300 (any one) and the relay connector 303 are mounted on one side of a mounting place of the CPU 500 on the printed circuit board 100. The relay board 305 is connected to the printed circuit board 100 via the relay connector 303. On the relay board 305, a differential transmission path 404 of USB standard and the USB terminal 301 (any the other) are mounted.

The USB terminal 301 is connected to the USB driver IC 511 via the differential transmission path 404 mounted on the relay board 305 and the differential transmission path 401 mounted on the printed circuit board 100, and further electrically connected therefrom to the CPU 500. On the other hand, the HDMI terminal 300 is directly mounted on the printed circuit board 100 as described above, connected to the HDMI driver IC 510 via the differential transmission path 400 mounted on the printed circuit board 100, and further electrically connected therefrom to the CPU 500. The HDMI driver IC 510 and the USB driver IC 511 are electrically connected to the CPU 500 to transmit and receive signals.

As described above in detail, according to this embodiment, the HDMI terminal 300 is mounted on the printed circuit board 100, the USB terminal 301 is mounted on the relay board 305, and the relay board 305 is connected to the printed circuit board 100 by the relay connector 303. This can prevent occurrence of crosstalk between differential signals having different characteristic impedance values, and prevent a reduction in transmission quality of signals in transmitting and receiving with an external device due to disturbance of the impedance values.

In the first to third embodiments, the case where the wiring structure of the printed circuit board of the present invention is applied to the image pickup apparatus (digital camera) has been described, but the present invention is not limited to this. The wiring structure of the printed circuit board of the present invention can be applied to, besides the digital camera, all kinds of electronic apparatuses having a printed circuit board (including a personal digital assistance (PDA), a mobile phone, a television, and a personal computer (information processing apparatus)).

In particular, the-third embodiment has the configuration in which the HDMI terminal is mounted on the printed circuit board, the USB terminal is mounted on the relay board, and the relay board is connected to the printed circuit board by the relay connector, but the present invention is not limited to this. The present invention may have a configuration in which a USB terminal is mounted on a printed circuit board, an HDMI terminal is mounted on a relay board, and the relay board is connected to the printed circuit board by a relay connector.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority the benefit of Japanese Patent Application No. 2009-028532 filed Feb. 10, 2009, which is hereby incorporated by reference herein in its entirety.

What is claimed is:

1. An electronic apparatus comprising: a printed circuit board;
   a first connection terminal mounted on the printed circuit board;
   a second connection terminal mounted on the printed circuit board;
   a processor unit mounted on the printed circuit board, and include a first terminal, a second terminal and a third terminal;
   an image pickup control unit mounted on the printed circuit board, and configured to obtain an image data,
   wherein the first and second connection terminals are mounted at an end on one side of the printed circuit board,
   wherein the first and second terminals are disposed in positions corresponding to a mounting place of the first and second connection terminals,
   wherein the third terminal is disposed so that the third terminal faces the first and second terminals,
   wherein a first wiring pattern formed on the printed circuit board is electrically connected the first connection terminal and the first terminal,
   wherein a second wiring pattern formed on the printed circuit board is electrically connected the second connection terminal and the second terminal,
   wherein a third wiring pattern formed on the printed circuit board is electrically connected the image pickup control unit and the third terminal,
   wherein the first and second wiring pattern are formed on the printed circuit board so that the first and second wiring pattern do not intersect each other, and
   wherein the third wiring pattern is formed on the printed circuit board so as not to intersect the first and second wiring patterns.

2. The electronic apparatus according to claim 1, wherein the first wiring pattern include a first differential transmission path, wherein the second wiring pattern include a second differential transmission path, and wherein a differential characteristic impedance value of the first differential transmission path is different from a differential characteristic impedance value of the second differential transmission path.

3. The electronic apparatus according to claim 1 further comprising: an image signal transmission board electrically connected to the image pickup control unit at an end on the other side of the printed circuit board.

4. The electronic apparatus according to claim 1, wherein the processor unit is disposed between the first or second connection terminal and the image pickup control unit.

5. The electronic apparatus according to claim 1, wherein the first connection terminal is an HDMI terminal, and wherein the second connection terminal is a USB terminal.

6. The electronic apparatus according to claim 1, wherein the first connection terminal is a first relay connector to which a first relay board is electrically connected, and wherein the second connection terminal is a second relay connector to which a second relay board is electrically connected.

7. The electronic apparatus according to claim 1 further comprising:
   a first driver unit mounted on the printed circuit board;
   a second driver unit mounted on the printed circuit board,
   wherein the first driver unit is disposed between the first connection terminal and the processor unit, and
   wherein the first driver unit is disposed between the second connection terminal and the processor unit.

8. The electronic apparatus according to claim 1 further comprising:
   a lens barrel having image pickup lens and an image sensor,
   wherein the lens barrel is disposed at an end on the other side of the printed circuit board.

9. An electronic apparatus comprising:
   a printed circuit board;
   a first connection terminal mounted on the printed circuit board;

a second connection terminal mounted on the printed circuit board;
a processor unit mounted on the printed circuit board, and include a first terminal, a second terminal and a third terminal;
an image signal transmission board which is electrically connected to the printed circuit board and configured to transmit an image data generated by an image sensor to the printed circuit board,
wherein the first and second connection terminals are mounted at an end on one side of the printed circuit board,
wherein the first and second terminals are disposed in positions corresponding to a mounting place of the first and second connection terminals,
wherein the third terminal is disposed so that the third terminal faces the first and second terminals,
wherein a first wiring pattern formed on the printed circuit board is electrically connected the first connection terminal and the first terminal,
wherein a second wiring pattern formed on the printed circuit board is electrically connected the second connection terminal and the second terminal,
wherein a third wiring pattern formed on the printed circuit board is electrically connected the image signal transmission board and the third terminal,
wherein the first and second wiring pattern are formed on the printed circuit board so that the first and second wiring pattern do not intersect each other, and
wherein the third wiring pattern is formed on the printed circuit board so as not to intersect the first and second wiring patterns.

10. The electronic apparatus according to claim 9,
wherein the first wiring pattern include a first differential transmission path,
wherein the second wiring pattern include a second differential transmission path, and
wherein a differential characteristic impedance value of the first differential transmission path is different from a differential characteristic impedance value of the second differential transmission path.

11. The electronic apparatus according to claim 9,
wherein the processor unit is disposed between the first or second connection terminal and the image signal transmission board.

12. The electronic apparatus according to claim 9,
wherein the first connection terminal is an HDMI terminal, and
wherein the second connection terminal is a USB terminal.

13. The electronic apparatus according to claim 9,
wherein the first connection terminal is a first relay connector to which a first relay board is electrically connected, and
wherein the second connection terminal is a second relay connector to which a second relay board is electrically connected.

14. The electronic apparatus according to claim 9 further comprising:
a first driver unit mounted on the printed circuit board;
a second driver unit mounted on the printed circuit board,
wherein the first driver unit is disposed between the first connection terminal and the processor unit, and
wherein the first driver unit is disposed between the second connection terminal and the processor unit.

15. The electronic apparatus according to claim 9 further comprising:
a lens barrel having image pickup lens and an image sensor,
wherein the lens barrel is disposed at an end on the other side of the printed circuit board.

* * * * *